United States Patent
Hwang et al.

(10) Patent No.: US 7,905,109 B2
(45) Date of Patent: Mar. 15, 2011

(54) RAPID COOLING SYSTEM FOR RTP CHAMBER

(75) Inventors: Chien Ling Hwang, Hsin Chu (TW); Yu-Liang Lin, Hsin-Chu (TW); Fu-Kang Tien, Jhubei (TW); Jyh-Chemg Sheu, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 811 days.

(21) Appl. No.: 11/226,721

(22) Filed: Sep. 14, 2005

(65) Prior Publication Data

US 2007/0056512 A1 Mar. 15, 2007

(51) Int. Cl.
F25D 17/02 (2006.01)

(52) U.S. Cl. ............. 62/434; 62/62; 62/64; 62/52.1; 62/304; 62/407; 134/7; 134/37; 438/16; 438/678

(58) Field of Classification Search ............. 62/62, 64, 62/52.1, 304, 407, 434; 134/7, 37; 438/16, 438/678

See application file for complete search history.

(56) References Cited

U.S. PATENT DOCUMENTS

| | | | | |
|---|---|---|---|---|
| 5,062,898 A | * | 11/1991 | McDermott et al. | 134/7 |
| 5,226,056 A | * | 7/1993 | Kikuchi et al. | 373/18 |
| 5,233,191 A | * | 8/1993 | Noguchi et al. | 438/16 |
| 5,244,501 A | * | 9/1993 | Nakayama et al. | 118/725 |
| 5,294,261 A | * | 3/1994 | McDermott et al. | 134/7 |
| 5,470,154 A | * | 11/1995 | Nishizawa et al. | 134/11 |
| 5,683,518 A | * | 11/1997 | Moore et al. | 118/730 |
| 5,765,578 A | * | 6/1998 | Brandt et al. | 134/7 |
| 5,953,634 A | * | 9/1999 | Kajita et al. | 438/687 |
| 6,310,327 B1 | * | 10/2001 | Moore et al. | 219/405 |
| 6,467,491 B1 | * | 10/2002 | Sugiura et al. | 134/1.3 |
| 6,863,741 B2 | * | 3/2005 | Orii et al. | 134/37 |
| 6,958,113 B2 | * | 10/2005 | Mizohata et al. | 204/224 R |
| 6,982,006 B1 | * | 1/2006 | Boyers et al. | 134/3 |
| 7,159,599 B2 | * | 1/2007 | Verhaverbeke et al. | 134/109 |
| 7,550,075 B2 | * | 6/2009 | Bertram et al. | 96/397 |
| 7,585,686 B2 | * | 9/2009 | Verhaverbeke et al. | 438/16 |
| 2005/0064703 A1 | * | 3/2005 | Kondo et al. | 438/633 |
| 2006/0107976 A1 | * | 5/2006 | Boyers et al. | 134/105 |

OTHER PUBLICATIONS

Fiory, A.T., "Methods in Rapid Thermal Annealing"; Sep. 20-22, 2000; International Conference on Advanced Thermal Processing of Semiconductors, Gaithersburg, MD; pp. 1-11.*

Fiory, A.T., "Recent Developments in Rapid Thermal Processing"; 2002; Department of Physics, New Jersey Institute of Technology, Newark, NJ; pp. 1-23.*

"Modular Process Technology—RTP—600xP Rapid Thermal Processing System"; Oct. 2005; National Institute of Technology, Gaithersburg, MD; pp. 1-10.*

* cited by examiner

*Primary Examiner* — Ljiljana (Lil) V Ciric

(74) *Attorney, Agent, or Firm* — Tung & Associates

(57) ABSTRACT

A rapid cooling system for a rapid thermal processing chamber includes a rapid thermal processing chamber having a wafer support for supporting a wafer. A tank having a supply of cooling liquid is provided in fluid communication with the chamber. A pump is provided in fluid communication with the rapid thermal processing chamber and the tank for pumping the cooling liquid from the tank to the chamber and cooling the wafer during the cooling phase of rapid thermal processing.

4 Claims, 3 Drawing Sheets

RAPID COOLING SYSTEM FOR RTP CHAMBER

FIELD OF THE INVENTION

The present invention relates to rapid thermal processing (RTP) chambers used in the annealing of semiconductor wafers. More particularly, the present invention relates to a rapid cooling system for RTP chambers which is suitable for the rapid cooling of wafers in rapid thermal anneal (RTA) processes, particularly in ultra shallow junction anneal processes.

BACKGROUND OF THE INVENTION

In the semiconductor production industry, various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Ion implantation is another processing step commonly used in the fabrication of the integrated circuits on the wafer. Ion implantation is a form of doping, in which a substance is embedded into the crystal structure of the semiconductor substrate to modify the electronic properties of the substrate. Ion implantation is a physical process which involves driving high-energy ions into the substrate using a high-voltage ion bombardment. The process usually follows the photolithography step in the fabrication of the circuits on the wafer.

The ion implantation process is carried out in an ion implanter, which generates positively-charged dopant ions in a source material. A mass analyzer separates the ions from the source material to form a beam of the dopant ions, which is accelerated to a high velocity by a voltage field. The kinetic energy attained by the accelerated ions enables the ions to collide with and become embedded in the silicon crystal structure of the substrate. Finally, the doped silicon substrate is subjected to a thermal anneal step to activate the dopant ions.

The thermal anneal step is typically carried out in a single-wafer rapid thermal processing (RTP) chamber as nitrogen and argon or helium is distributed into the chamber. In the RTP chamber, the wafer is subjected to rapid heating (up to about 150 degrees C. per second) to a target temperature of up to about 1000 degrees C., with a short dwell time. The rapid heating of the wafer anneals the wafer and restores lattice damage and electrically activates the implanted dopant ions. Furthermore, rapid thermal processing is commonly used to facilitate optimum junction depth control in shallow implants.

In advanced lamp RTP anneal processes (particularly spike anneal processes), backside helium is used to cool the wafer after annealing. However, the use of backside helium to cool the wafer is incapable of facilitating the rapid cooling needed for the latest advances in semiconductor technology, since slow cooling results in the short channel effect. Furthermore, the cooling uniformity of backside helium is poor. Accordingly, a new and improved rapid cooling system is needed for the rapid cooling of wafers after a rapid thermal processing (RTP) step, particularly after shallow junction anneal processes.

SUMMARY OF THE INVENTION

The present invention is generally directed to a rapid cooling system for a rapid thermal processing chamber. In one embodiment, the rapid cooling system includes a rapid thermal processing chamber having a wafer support for supporting a wafer. A tank having a supply of cooling liquid is provided in fluid communication with the chamber. A pump is provided in fluid communication with the rapid thermal processing chamber and the tank for pumping the cooling liquid from the tank to the chamber and cooling the wafer during the cooling phase of rapid thermal processing.

BRIEF DESCRIPTION OF THE DRAWINGS

The invention will now be described, by way of example, with reference to the accompanying drawings, in which:

FIG. 7B is a schematic diagram which illustrates cooling of a wafer in an RTP chamber according to the present invention by flowing cooled nitrogen into the chamber along with room temperature nitrogen and helium;

DETAILED DESCRIPTION OF THE INVENTION

Figure 1:
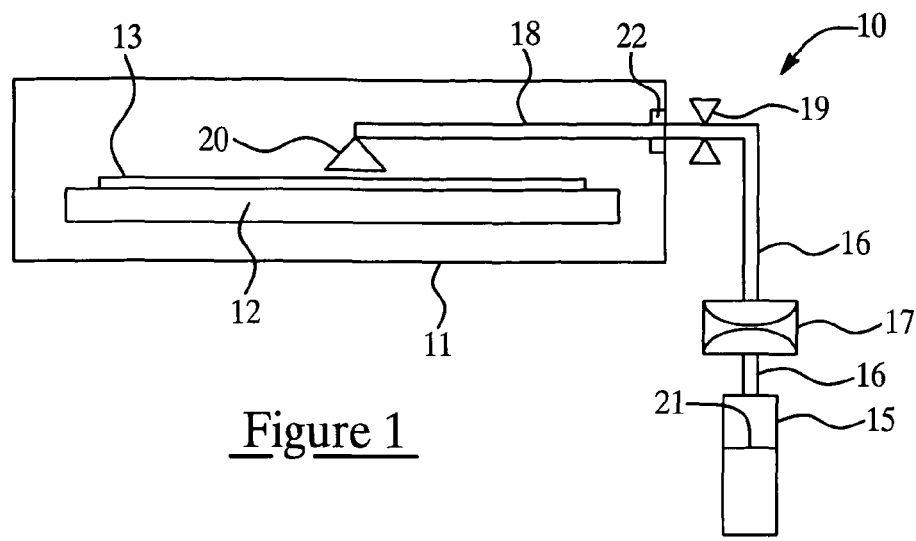
FIG. 1 is a schematic view of an illustrative embodiment of a low-pressure rapid cooling system according to the present invention, which system is adapted to use liquid nitrogen as the cooling medium.

The present invention is generally directed to a rapid cooling system for an RTP (rapid thermal processing) system, particularly for use to rapidly cool wafers in ultra shallow junction anneal processes. Referring initially to FIG. 1, an illustrative embodiment of a low-pressure rapid cooling system of the present invention is generally indicated by reference numeral 10. The rapid cooling system 10 can be used in conjunction with an RTP (rapid thermal processing) chamber 11, which may be conventional. A wafer support 12 is provided in the RTP chamber 11 to support a wafer 13. The RTP chamber 11 includes conventional components, such as halogen lamps 14 and a thermostat system 14a, for example, to facilitate rapid thermal processing of the wafer 13 in the RTP chamber 11.

The rapid cooling system 10 includes an insulated liquid nitrogen tank 15 which is adapted to contain a supply of liquid nitrogen 21. A distribution conduit 16 extends from the liquid nitrogen tank 15, and a pump 17 is provided in the distribution conduit 16. A distribution arm 18, which may be fitted with a valve 19, extends from the distribution conduit 16. A viewing port 22 may be provided in the RTP chamber 11. The distribution arm 18 extends into the RTP chamber 11, typically through the viewing port 22. A nozzle 20, which may have a flared configuration, as shown, or which may be any suitable alternative design, is provided on the distribution arm 18, inside the RTP chamber 11.

In typical operation of the rapid cooling system 10, the wafer 13 is placed on the wafer support 12 inside the RTP chamber 11. The wafer 13 is subjected to a rapid thermal anneal (RTA) process, in which the wafer 13 is initially rapidly heated (at up to about 150 degrees C. per second) to a target temperature of typically about 1050 degrees C. In the ensuing cooling phase, the wafer 13 is rapidly cooled by operation of the rapid cooling system 10. This is carried out by setting the RTP chamber 11 at an interior pressure of typically about 1 atmosphere. The wafer 13 is then rotated in the RTP chamber 11 while the pump 17 is operated to pump the liquid nitrogen 21, at a pressure of typically greater than about 1 atmosphere, from the liquid nitrogen tank 15 and through the distribution conduit 16, distribution arm 18 and open valve 19, respectively. The liquid nitrogen 21 is then dispensed through the nozzle 20 and against the surface of the wafer 13. The progress of the RTP process, as well as dispensing of the liquid nitrogen 21 from the nozzle 20 and onto the wafer 13, can be viewed through the view port 22. Accordingly, upon entry of the liquid nitrogen 21 into the RTP chamber 11, the liquid nitrogen 21 undergoes a phase change to the gaseous phase and contacts the wafer 13, thereby cooling the wafer 13 by a phase change endothermic reaction from the target temperature of approximately 1050 degrees C. to approximately 1000 degrees C. in typically about 2 seconds. This improves the process performance of the RTP chamber 11 as well as improves wafer throughput. The controller (not shown) for the RTP chamber 11 may be connected to the liquid nitrogen tank 15 to facilitate syncronization of the cooling phase carried out using the rapid cooling system 10 with the remainder of the RTP process.

Figure 2:
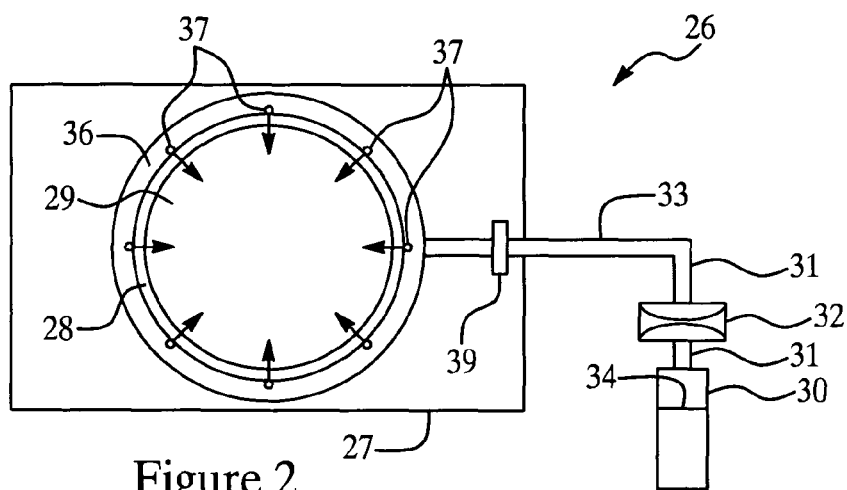
FIG. 2 is a schematic view of an illustrative embodiment of a high-pressure rapid cooling system according to the present invention, which system is adapted to use super critical carbon dioxide ($SCCO_2$) as the cooling medium.

Referring next to FIG. 2, another illustrative embodiment of a high-pressure rapid cooling system according to the present invention is generally indicated by reference numeral 26. The rapid cooling system 26 can be used in conjunction with an RTP (rapid thermal processing) chamber 27, which may be conventional. A wafer support 28 is provided in the RTP chamber 27 to support a wafer 29. The rapid cooling system 26 includes an insulated supercritical carbon dioxide ($SCCO_2$) tank 30 which is adapted to contain a supply of $SCCO_2$ 34. A distribution conduit 31 extends from the $SCCO_2$ tank 30, and a pump 32 is provided in the distribution conduit 31. A distribution arm 33 extends from the distribution conduit 31. A viewing port 39 may be provided in the RTP chamber 27. The distribution arm 33 extends into the RTP chamber 11, typically through the viewing port 39. A nozzle ring 36, having multiple nozzle openings 37 spaced around the inner circumference thereof, is provided in fluid communication with the distribution arm 33, inside the RTP chamber 11, above and in generally encircling relationship to the wafer support 28.

In typical operation of the rapid cooling system 26, the wafer 29 is placed on the wafer support 28 inside the RTP chamber 27 and subjected to a rapid thermal anneal (RTA) process. Accordingly, the wafer 29 is rapidly heated (at up to about 150 degrees C. per second) to a target temperature of typically about 1050 degrees C. and then rapidly cooled by operation of the rapid cooling system 26. The RTP chamber 27 is initially set at an interior pressure of typically about 1 atmosphere. The wafer 29 is then rotated in the RTP chamber 27 while the pump 32 is operated to pump the $SCCO_2$ 34 from the $SCCO_2$ tank 30 and through the distribution conduit 31, distribution arm 33 and nozzle ring 36, respectively, at a pressure of typically about 1~200 atmospheres. The $SCCO_2$ 34 is then ejected, under high pressure, from the nozzle openings 37 and against the surface of the wafer 29. Upon entry into the RTP chamber 27, the liquid $SCCO_2$ 34 undergoes a phase change from the liquid to the gaseous phase and contacts the wafer 29, thereby cooling the wafer 29 by a phase change endothermic reaction from the target temperature of approximately 1050 degrees C. to approximately 1000 degrees C. in typically about 2 seconds. This improves the process performance of the RTP chamber 27 as well as improves wafer throughput. The progress of the RTP process and wafer cooling process can be viewed through the view port 39. The controller (not shown) for the RTP chamber 27 may be connected to the $SCCO_2$ tank 30 to facilitate syncronization of the cooling phase carried out using the rapid cooling system 26 with the remainder of the RTP process.

Figure 3:
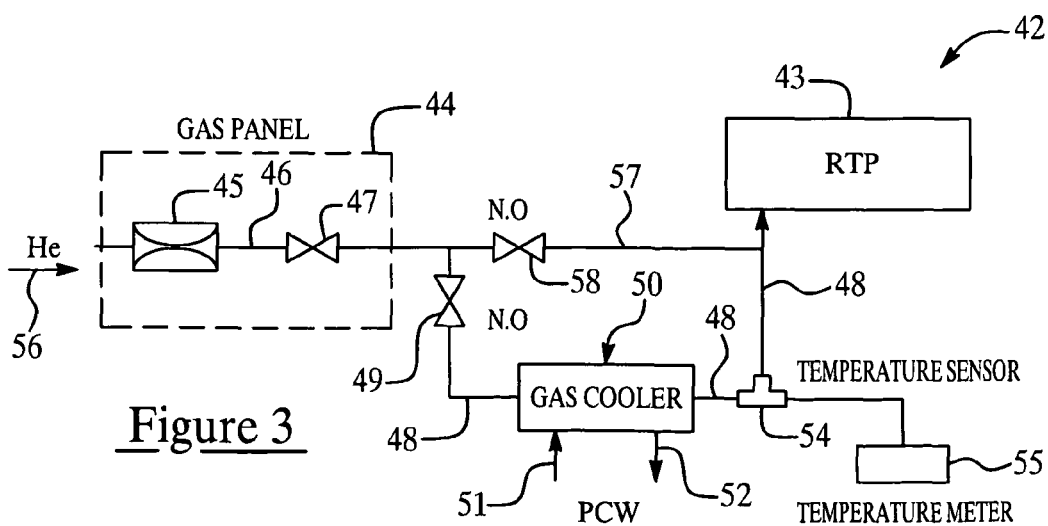
FIG. 3 is a schematic view of another illustrative embodiment of the rapid cooling system according to the present invention, which system is adapted to facilitate a flow mode of the cooling medium to an RTP chamber.

Referring next to FIG. 3, another illustrative embodiment of a rapid cooling system according to the present invention is generally indicated by reference numeral 42. The rapid cooling system 42 facilitates a steady flow of cooled helium to an RTP chamber 43, as will be hereinafter described. The rapid cooling system 42 includes a gas panel 44 within which is provided a distribution line 46 and a pump 45 in the distribution line 46. A valve 47 is typically provided in the distribution line 46, downstream of the pump 45. A cooling line 48 and a bypass line 57, in which is provided a bypass valve 58, branch from the distribution line 46. A valve 49 is typically provided in the cooling line 48.

A gas cooler 50 is provided in the cooling line 48, typically downstream of the valve 49. The gas cooler 50 typically includes an inlet 51 and outlet 52 to faciltate flow of a fluid cooling medium (not shown) through the gas cooler 50. Alternatively, the gas cooler 50 or the fluid cooling medium flowing through the inlet 51 and outlet 52 may be cooled using thermoelectric generators (not shown), a compressor (not shown) or other technique known to those skilled in the art. A temperature sensor 54 may be provided in the cooling line 48 and a temperature meter 55 connected to the temperature sensor 54 to measure and indicate, respectively, the temperature of cooled helium flowing through the cooling line 48. The portion of the cooling line 48 which is downstream of the temperature sensor 54 leads into the RTP chamber 43, and the bypass line 57 connects into the downstream portion of the cooling line 48.

In typical operation of the rapid cooling system 42, upon completion of the heating phase of an RTP process carried out in the RTP chamber 43, the pump 45 pumps helium 56 through the distribution line 46, cooling line 48, gas cooler 50, temperature sensor 54 and into the RTP chamber 43, respectively. As it flows through the gas cooler 50, the helium 56 is cooled to a temperature of typically about −100 degrees C. Accordingly, the helium 56 is distributed in a steady flow mode from the gas panel 44 to the RTP chamber 43. In the RTP chamber 43, the cooled helium 56 cools the wafer (not shown) from a target temperature of typically about 1050 degrees C. to a temperature of typically about 1000 degrees C. in about 2 seconds. The temperature sensor 54 senses the temperature of the helium 56 flowing through the cooling line 48, and the temperature meter 55 indicates the measured temperature of the helium 56.

Figure 4:
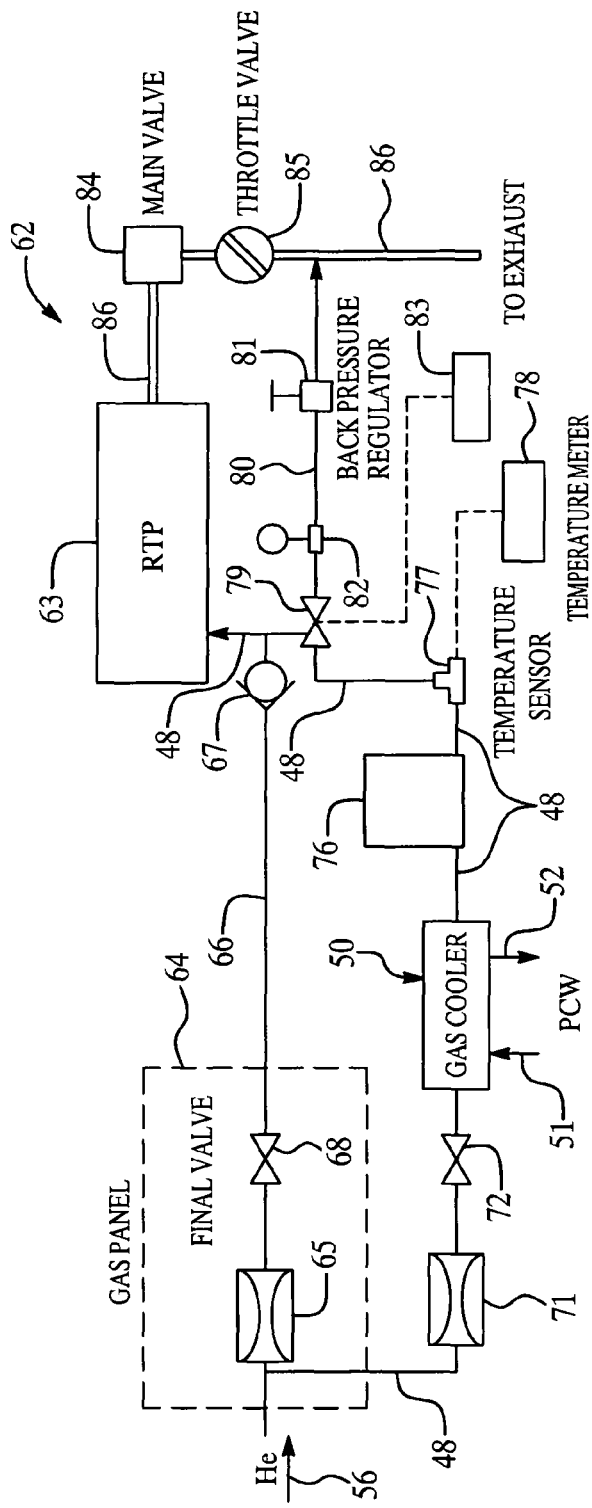
FIG. 4 is a schematic view of still another illustrative embodiment of the rapid cooling system according to the present invention, which system is adapted to facilitate a burst mode of the cooling medium to an RTP chamber.

Referring next to FIG. 4, still another illustrative embodiment of a rapid cooling system according to the present invention is generally indicated by reference numeral 62. The rapid cooling system 62 facilitates a burst flow of cooled helium 56 to an RTP chamber 63, as will be hereinafter described. The rapid cooling system 62 includes a gas panel 64, within which is provided a bypass line 66 having a pump 65 and a valve 68. A cooling line 48 branches from the bypass line 66, upstream of the pump 65. A pump 71 is provided in the cooling line 48, and a valve 72 is typically provided in the cooling line 48, downstream of the pump 65.

A gas cooler 50, which typically includes an inlet 51 and an outlet 52 for flow of a cooling medium (not shown) through the gas cooler 50, is provided in the cooling line 48. Alternatively, the gas cooler 50 or the fluid cooling medium flowing through the inlet 51 and outlet 52 may be cooled using thermoelectric generators (not shown), a compressor (not shown) or other technique known to those skilled in the art, as was noted herein above. A gas buffer housing 76, which may be cooled by thermoelectric generators (not shown), a compressor (not shown) or other suitable technique known to those skilled in the art, may be provided in the cooling line 48, downstream of the gas cooler 50. A temperature sensor 77 may be provided in the cooling line 48, downstream of the gas housing 76, and a temperature meter 78 connected to the temperature sensor 77 to measure and indicate, respectively, the temperature of cooled helium flowing through the cooling line 48. The downstream portion of the cooling line 48 leads into the RTP chamber 63, and the bypass line 66 connects into the downstream portion of the cooling line 48. A check valve 67 is provided in the bypass line 67 and facilitates the one-way flow of helium 56 through the bypass line 66, to the downstream portion of the cooling line 48.

A valve 79 is provided in the downstream portion of the cooling line 48, and a back pressure line 80 extends from the valve 79. A back pressure regulator 81 and a pressure gauge 52 are provided in the back pressure line 80 to regulate and indicate, respectively, the pressure of helium 56 flowing through the back pressure line 80. A timer 83 is connected to the back pressure line 80 at the valve 79 to time the intermittent opening and closing of the valve 79. An exhaust line 86, in which is provided a main valve 84 and a throttle valve 85, extends from the exhaust port of the RTP chamber 63.

In typical operation of the rapid cooling system 62, upon completion of the heating phase of an RTP process carried out in the RTP chamber 63, the pump 71 pumps helium 56 through the cooling line 48, gas cooler 50, gas buffer housing 76, temperature sensor 77 and into the RTP chamber 63, respectively. As it flows through the gas cooler 50 and gas buffer housing 76, the helium 56 is cooled to a temperature of typically about −100 degrees C. Accordingly, the cooled helium 56 is distributed in a burst flow mode from the gas panel 64 to the RTP chamber 63 as the valve 79, which is initially open, is then closed by the timer 83 after a preset period of time. After closure of the valve 79, the uncooled or room-temperature helium 56 is pumped through the bypass line 66 through the check valve 67, the cooling line 48 and into the RTP chamber 63, respectively, to maintain a baseline flow of the helium 56 to the RTP chamber 63. In the RTP chamber 63, the cooled helium 56 cools the wafer (not shown) from a target temperature of typically about 1050 degrees C. to a temperature of typically about 1000 degrees C. in about 2 seconds. The uncooled helium 56 continues to cool the wafer at a slower rate. The temperature sensor 77 senses the temperature of the helium 56 flowing through the cooling line 48, and the temperature meter 78 indicates the measured temperature of the helium 56.

Figure 8:
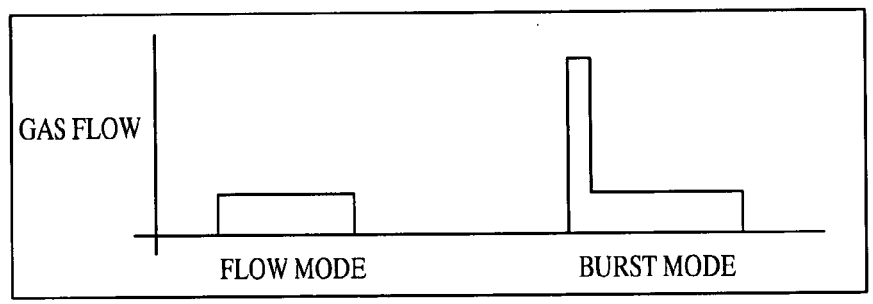
FIG. 8 is a graph illustrating the volume of cooling gas introduced into an RTP chamber over time using a flow mode vs. the volume of cooling gas introduced into an RTP chamber over time using a burst mode according to the present invention.

The graph of FIG. 8 illustrates a gas flow vs. time curve using the flow mode facilitated by operation of the rapid cooling system 42 of FIG. 3, compared to a gas flow vs. time curve using the burst mode facilitated by operation of the rapid cooling system 62 of FIG. 4. Accordingly, in the flow mode, the volume of cooled helium which is distributed to the RTP chamber is constant throughout the cooling phase of the rapid thermal anneal process. In contrast, in the burst mode, the volume of cooled helium distributed to the RTP chamber is initially large and then rapidly decreases, followed by a constant baseline volume of uncooled helium for the rest of the cooling phase. The wafer-cooling capability of the burst mode is considered to be more stable than that of the flow mode, although the system configuration for the burst mode is more complex.

Figure 5:
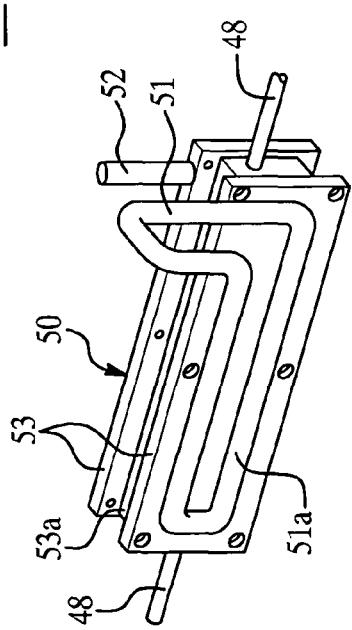
FIG. 5 is a perspective view of an illustrative gas cooler which is suitable for implementation in the rapid cooling system shown in FIG. 3 or FIG. 4.

Referring next to FIG. 5, an illustrative configuration for a gas cooler 50 which is suitable for use in the rapid cooling system 42 which was heretofore described with respect to FIG. 3 and in the rapid cooling system 62 which was heretofore described with respect to FIG. 4 is shown. The gas cooler 50 includes a gas distribution plate 53a through which extends the cooling line 48 of the rapid cooling system 42, 62. The gas distribution plate 53a is sandwiched between a pair of cooling plates 53, through each of which extends a cooling conduit 51a. The cooling conduits 51a of the cooling plates 53 are connected to each other across the gas distribution plate 53a. The inlet 51 for the cooling medium is provided in fluid communication with the cooling conduit 51a of one cooling plate 53 and the outlet 52 for the cooling medium is provided in fluid communication with the cooling conduit 51a of the other cooling plate 53. Accordingly, a cooling fluid (not shown) is distributed through the inlet 51, the cooling conduit 51a of one cooling plate 53, the cooling conduit 51a of the other cooling plate 53 and the outlet 52, respectively, to cool the cooling plates 53 and the gas distribution plate 53a as the helium 56 flows through the gas distribution plate 53a in the cooling line 48.

Figure 6:
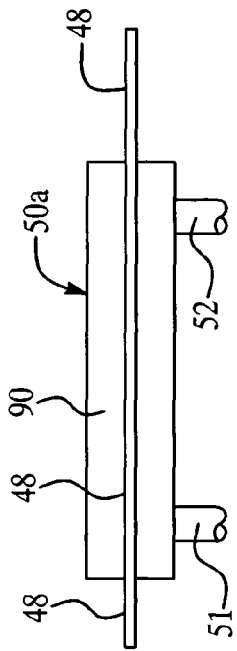
FIG. 6 is a schematic view of an alternative configuration for an illustrative gas cooler which is suitable for implementation in the rapid cooling system shown in FIG. 3 or FIG. 4.

Referring next to FIG. 6, another illustrative configuration for a gas cooler 50a which is suitable for use in the rapid cooling system 42 which was heretofore described with respect to FIG. 3 and in the rapid cooling system 62 which was heretofore described with respect to FIG. 4 is shown. The gas cooler 50a includes a housing 90 which may be stainless steel, for example. The cooling line 48 of the rapid cooling system 42 or the rapid cooling system 62 extends through the housing 90. The inlet 51 and the outlet 52 for the cooling medium are disposed in fluid communication with the housing 90. Accordingly, a cooling fluid (not shown) is distributed through the inlet 51, the housing 90 and the outlet 52, respectively, to cool the helium 56 as the helium 56 flows through the housing 90 in the cooling line 48.

Figure 7A:
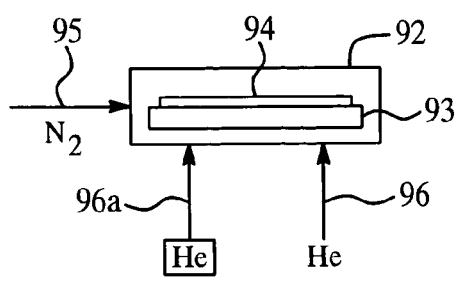
FIG. 7A is a schematic diagram which illustrates cooling of a wafer in an RTP chamber according to the present invention by flowing cooled helium into the chamber along with room temperature nitrogen and helium.

Referring next to FIGS. 7A-7D, in accordance with the present invention, a wafer 94 can be rapidly cooled in various ways during rapid thermal processing in an RTP chamber 92. For example, as shown in FIG. 7A, as the wafer 94 rests on a wafer support 93 in the RTP chamber 92, nitrogen gas 95 and helium gas 96 are distributed into the RTP chamber 92 at room temperature. Additionally, pre-cooled helium gas 96a, having a temperature of typically about −100 degrees C., is simultaneously introduced into the RTP chamber 92. Accordingly, the wafer 94 is cooled from a target temperature of typically about 1050 degrees C. to typically about 1000 degrees C. in typically about 2 seconds.

Figure 7C:
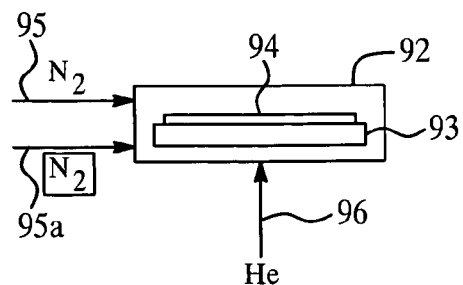
FIG. 7C is a schematic diagram which illustrates cooling of a wafer in an RTP chamber according to the present invention by flowing cooled helium into the chamber along with room temperature nitrogen.
Figure 7C:
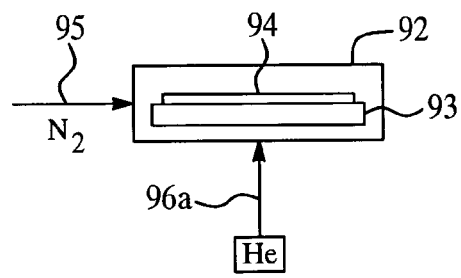

As shown in FIG. 7B, the wafer 94 can alternatively be rapidly cooled by introducing room-temperature nitrogen gas 95 and room-temperature helium gas 96 into the RTP chamber 92 while distributing pre-cooled helium gas 95a into the RTP chamber 92. As shown in FIG. 7C, the wafer 94 can alternatively be rapidly cooled by simultaneously introducing room-temperature nitrogen gas 95 and pre-cooled helium gas 96a into the RTP chamber 92.

Figure 7D:
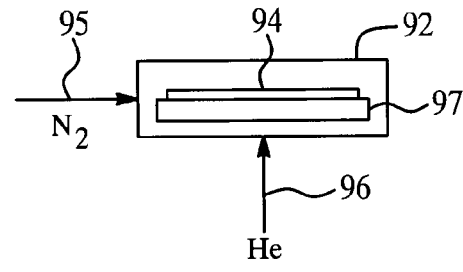
FIG. 7D is a schematic diagram which illustrates cooling of a wafer in an RTP chamber according to the present invention by resting the wafer on a super low-temperature plate.

As shown in FIG. 7D, in an alternative technique, a super low temperature plate 97 is provided in the RTP chamber 92. A supply (not shown) of a cooling fluid (not shown) is provided in fluid communication with the super low temperature plate 97 to distribute the cooling fluid through the super low temperature plate 97. In use, the wafer 94 is supported on the super low temperature plate 97, and a rapid thermal anneal process is carried out on the wafer 94. At the cooling phase of the process, the cooling fluid (not shown) having a temperature of typically about −100 degrees C. is distributed through the super low temperature plate 97. Consequently, the wafer 94 is rapidly cooled from a target temperature of typically about 1050 degrees C. to typically about 1000 degrees C. in typically about 2 seconds.

Figure 9:
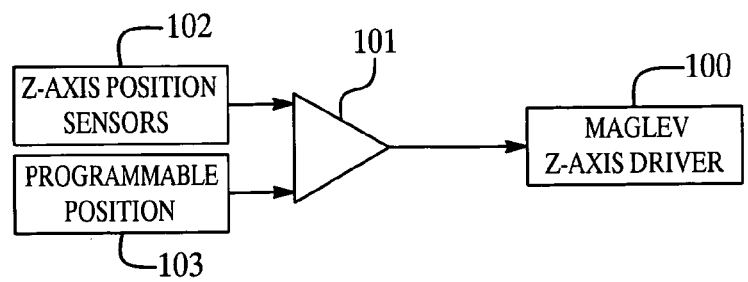
FIG. 9 is a block diagram which illustrates providing programmable Z-axis positioning capability to a Maglev wafer positioning system in order to facilitate rapid cooling of a wafer according to the present invention.

Referring next to FIG. 9, rapid cooling of a wafer during the cooling phase of a rapid thermal anneal process may be carried out by providing programmable capability to a Maglev Z-axis driver 100 which supports and provides smooth and rapid rotation to a wafer support (not shown) in an RTP chamber (not shown). The Maglev Z-axis driver 100 may be. conventional and includes a controller 101 and Z-axis position sensors 102 which are connected to the controller 101 to sense the Z-axis position of the wafer support (not shown) in the RTP chamber. Conventionally, the Z-axis positioning capability of the Maglev Z-axis driver 100 is fixed and not adjustable. According to the present invention, programmable Z-axis capability 103 is provided to the Maglev Z-axis driver 100 to enhance cooling of the wafer during the cooling phase of an RTP process. By Z-axis adjustment of the Maglev Z-axis driver 100 during the cooling phase of the RTP process, it is estimated that the wafer cooling rate can be increased from about 55 degrees C./second to about 85 degrees C./second. Furthermore, Z-axis adjustment of the Maglev Z-axis driver 100 can be combined with any of the other techniques which were heretofore described with respect to the invention to rapidly cool a wafer during the cooling phase of an RTP process.

While the preferred embodiments of the invention have been described above, it will be recognized and understood that various modifications can be made in the invention and the appended claims are intended to cover all such modifications which may fall within the spirit and scope of the invention.

What is claimed is:

1. A rapid cooling system for a semiconductor wafer rapid thermal processing (RTP) system, comprising:
   a rapid thermal processing (RTP) chamber having a semiconductor wafer support for supporting a semiconductor wafer, said RTP chamber having lamps adapted to anneal said semiconductor wafer;
   a tank having a supply of liquid nitrogen provided in fluid communication with said RTP chamber;
   a pump provided in fluid communication with and between said rapid thermal processing (RTP) chamber and said tank, said pump adapted to pump said liquid nitrogen from said tank to said RTP chamber; and
   a flared nozzle provided in said chamber above said semiconductor wafer support and disposed in fluid communication with said tank for discharging said liquid nitrogen against the semiconductor wafer.

2. The system of claim 1 further comprising a distribution conduit provided between said tank and said chamber and wherein said pump is provided in said distribution conduit.

3. The system of claim 2 further comprising a distribution arm provided between said distribution conduit and said chamber and wherein said nozzle is carried by said distribution arm.

4. A rapid cooling system for a semiconductor wafer rapid thermal processing (RTP) system, comprising:
   a rapid thermal processing (RTP) chamber having halogen lamps adapted to anneal a semiconductor wafer; and
   a low temperature plate provided in said RTP chamber, said low temperature plate adapted to receive a cooling fluid distributed through said low temperature plate to cool said semiconductor wafer while supporting said semiconductor wafer.

* * * * *